United States Patent
Kondou et al.

(10) Patent No.: US 8,655,126 B2
(45) Date of Patent: Feb. 18, 2014

(54) METHOD OF MANUFACTURING OPTICAL WAVEGUIDE HAVING MIRROR FACE, AND OPTOELECTRONIC COMPOSITE WIRING BOARD

(75) Inventors: Naoyuki Kondou, Sakai (JP); Tohru Nakashiba, Osaka (JP); Junko Yashiro, Hirakata (JP); Shinji Hashimoto, Kadoma (JP)

(73) Assignee: Panasonic Corporation, Osaka (JP)

( * ) Notice: Subject to any disclaimer, the term of this patent is extended or adjusted under 35 U.S.C. 154(b) by 118 days.

(21) Appl. No.: 13/258,551

(22) PCT Filed: Mar. 26, 2010

(86) PCT No.: PCT/JP2010/056040
§ 371 (c)(1), (2), (4) Date: Sep. 22, 2011

(87) PCT Pub. No.: WO2010/110496
PCT Pub. Date: Sep. 30, 2010

(65) Prior Publication Data
US 2012/0020613 A1    Jan. 26, 2012

(30) Foreign Application Priority Data
Mar. 26, 2009 (JP) ................. 2009-077791

(51) Int. Cl.
*G02B 6/26* (2006.01)
*G02B 6/42* (2006.01)
*H01L 21/00* (2006.01)

(52) U.S. Cl.
USPC ............... 385/48; 385/43; 385/88; 438/42

(58) Field of Classification Search
None
See application file for complete search history.

(56) References Cited

U.S. PATENT DOCUMENTS

| | | |
|---|---|---|
| 5,999,670 A | 12/1999 | Yoshimura et al. |
| 7,734,124 B2 | 6/2010 | Yonekura et al. |
| 7,949,220 B2 | 5/2011 | Shibata et al. |
| 2004/0037487 A1 | 2/2004 | Nakaya et al. |
| 2004/0234224 A1 | 11/2004 | Ishizaki et al. |
| 2005/0041906 A1 | 2/2005 | Sugama et al. |

(Continued)

FOREIGN PATENT DOCUMENTS

| | | |
|---|---|---|
| CN | 101034188 | 9/2007 |
| CN | 101122655 | 2/2008 |

(Continued)

OTHER PUBLICATIONS

Taiwan Office action, dated Sep. 26, 2013 along with an english translation thereof.

*Primary Examiner* — Jerry Rahll
(74) *Attorney, Agent, or Firm* — Greenblum & Bernstein, P.L.C.

(57) ABSTRACT

In order to provide a method of manufacturing an optical waveguide, which enables the formation of a smooth mirror face, the following method of manufacturing an optical waveguide having a mirror face is used. The method includes: a photocurable resin sheet laminating step of laminating an uncured photocurable resin sheet for forming a core on a surface of a first cladding layer that has been formed on a substrate; a mirror face forming step of forming a mirror face for guiding light to the core by pressing a die provided with a blade having, in a cross-section, a 45° inclined plane into the photocurable resin sheet; a core forming step of forming a core having the mirror face positioned at an end thereof by selectively exposing to light, and developing, the photocurable resin sheet; and a cladding layer forming step of forming a second cladding layer so as to bury the core.

7 Claims, 12 Drawing Sheets

(56) References Cited

U.S. PATENT DOCUMENTS

| | | |
|---|---|---|
| 2005/0238278 A1 | 10/2005 | Nakashiba et al. |
| 2006/0133764 A1 | 6/2006 | Okubora et al. |
| 2006/0177188 A1 | 8/2006 | Ishizaki et al. |
| 2006/0204196 A1 | 9/2006 | Naitou et al. |
| 2007/0189661 A1 | 8/2007 | Nakashiba et al. |
| 2008/0107881 A1 | 5/2008 | Nakashiba et al. |
| 2008/0113168 A1 | 5/2008 | Nakashiba et al. |
| 2008/0193094 A1 | 8/2008 | Enami et al. |
| 2008/0279518 A1 | 11/2008 | Yonekura et al. |
| 2009/0074354 A1 | 3/2009 | Yanagisawa et al. |
| 2009/0080846 A1 | 3/2009 | Shao et al. |
| 2009/0080847 A1 | 3/2009 | Shao et al. |
| 2009/0257707 A1 | 10/2009 | Shibata et al. |

FOREIGN PATENT DOCUMENTS

| | | |
|---|---|---|
| CN | 101216576 | 7/2008 |
| JP | 10-300961 | 11/1998 |
| JP | 2001-110188 | 4/2001 |
| JP | 2004-62157 | 2/2004 |
| JP | 2006-98798 | 4/2006 |
| JP | 2006-171641 | 6/2006 |
| JP | 2007-17521 | 1/2007 |
| JP | 2008-58296 | 3/2008 |
| JP | 2008-59001 | 3/2008 |
| TW | 200819018 | 4/2008 |
| TW | 200848815 | 12/2008 |
| WO | 2006/001434 | 1/2006 |

# METHOD OF MANUFACTURING OPTICAL WAVEGUIDE HAVING MIRROR FACE, AND OPTOELECTRONIC COMPOSITE WIRING BOARD

TECHNICAL FIELD

The present invention relates to a method of manufacturing an optical waveguide having a mirror face, and an optoelectronic composite wiring board having such an optical waveguide.

BACKGROUND ART

One known method for the input and output of light in optical fibers and planar optical waveguides is a method that is carried out with micromirrors. Micromirrors are inclined endfaces having an angle of, for example, 45 degrees so as to change the light path 90 degrees.

In a known method of forming such mirrors, the inclined endfaces are formed by cutting into an optical waveguide with a dicing blade.

For example, Patent Document 1 below describes carrying out a cutting operation in which a dicing blade equipped with a cutting edge having an apex angle of 90°, or a one-sided cutting edge having a substantially wedge-shaped cross-section with an apex angle of 45°, is applied perpendicular to the optical waveguide. By means of such a cutting operation, a V-shaped groove is formed in the optical waveguide, thereby forming a micromirror having an inclined plane in cross-section. It is also mentioned that a micromirror formed in this way emits the light that propagates through the optical waveguide outside the plane of the waveguide, or causes the optical path of light that enters from outside the plane of the optical waveguide to be coupled to the optical waveguide. However, when a method of cutting into an optical waveguide with a dicing blade like that disclosed in Patent Document 1 is used, because the mirror face is formed by a cutting operation following formation and curing of the optical waveguide, cutting debris remains around the optical waveguide, which may cause optical loss to arise.

Patent Document 2 below discloses a process wherein a stamper on which has been formed a raised pattern corresponding to a core shape is pressed against a liquid photocurable resin for cladding formation, following which the pressed face is irradiated with ultraviolet light from the opposite side to form a core groove. A core is then formed by filling the resulting core groove with a liquid core material. With such a method, by forming mirror shapes on the stamper, it is possible to form mirror faces. However, in cases like that disclosed in Patent Document 2 where a stamper on which a raised pattern has been formed is pressed into a liquid photocurable resin for cladding formation, because liquid photocurable resin in unexposed areas sticks to the surface of the stamper pattern each time pressing is carried out, the surface must be cleaned after each pressing operation, which makes the process cumbersome. Another problem has been that, in a method where a core groove having a mirror shape is created then is filled with resin, shadowing of the mirror face occurs, making it difficult to form a reflective film on the mirror face. Also, in a method where the core is formed by filling a core groove with resin and curing the resin, shrinkage that arises during curing of the resin subjects the mirror face to shear strain, which tends to lead to peeling of the reflective film. In addition, because a resin varnish is used to fill a groove several tens of micrometers in depth with resin, vaporization of the solvent has a deleterious effect on the environment at the manufacturing site. Moreover, a thin film of the core material having a high refractive index sometimes remains on the surface of the cladding, as a result of which light leakage may arise from such places. Finally, because the stamper pattern must be provided with a taper in order to lower the release resistance, it has only been possible to create cores having cross-sectional shapes that are trapezoidal. In such cases, the coupling loss to light-emitting devices, light-receiving devices, fibers and the like increases.

Patent Document 3 discloses a method of forming a mirror face by driving a working head having a face which intersects the leading end of the working head at an angle of 45 degrees into a light-guiding sheet composed of a thermoplastic resin or a thermoset resin. However, a method like that disclosed in Patent Document 3 is problematic in that the impact when driving in the working head may cause cracks to form in the optical waveguide and the shaped face tends not to be smooth.

CITATION LIST

Patent Literature

Patent Document 1: Japanese Patent Application Laid-open No. H10-300961
Patent Document 2: WO 2006/001434
Patent Document 3: Japanese Patent Application Laid-open No. 2006-171641

SUMMARY OF INVENTION

It is therefore an object of the present invention to provide a method of manufacturing an optical waveguide which is capable of forming a smooth mirror face.

The inventive method of manufacturing an optical waveguide having a mirror face includes: a photocurable resin sheet laminating step of laminating an uncured photocurable resin sheet for forming a core on a surface of a first cladding layer that has been formed on a substrate; a mirror face forming step of forming a mirror face for guiding light to a core by pressing a die provided with a blade which possesses a single edge having, in a cross-section, an inclined angle of 45 degrees or a double edge having, in a cross-section, two 45-degree inclined angles such that the blade substantially perpendicularly penetrates the photocurable resin sheet; a core forming step of forming a core having the mirror face positioned at an end thereof by selectively exposing to light, and developing, the photocurable resin sheet; and a cladding layer forming step of forming a second cladding layer so as to bury the core.

The inventive optoelectronic composite wiring board is characterized by including, on a substrate having an electrical circuit formed thereon, an optical waveguide formed by any of the foregoing methods of manufacturing an optical waveguide having a mirror face.

The objects, features, aspects and advantages are clearly explained by the following detailed description and the attached figures.

DESCRIPTION OF EMBODIMENTS

First Embodiment

Figure 1A:
FIGS. 1A to 1F are schematic cross-sectional diagrams illustrating a method of manufacture according to a first embodiment of the present invention.

One embodiment of the inventive method of manufacturing an optical waveguide having a mirror face is described in detailed while referring to the attached drawings.

FIG. 1 schematically illustrates the steps in the manufacture of a planar optical waveguide 10 having mirror faces M. Shown in FIG. 1 are a substrate 1, an undercladding layer 2 (first cladding layer), an uncured photocurable resin sheet 3 for forming a core 3a, an overcladding layer (second cladding layer) 4, mirror faces M, and a die 5 equipped with blades 5a which possess a double edge having, in cross-section, two 45-degree inclined angles. The die 5 is formed of a light-transmitting material. As shown in the perspective view seen from the transfer face side in FIG. 2, the die 5 is formed in such a way that V-shaped blades 5a formed by the intersection of, in a cross-section, two 45-degree inclined planes hang downward from a planar transfer face 5b. In addition, a photomask 5c having a predetermined core pattern-shaped opening 5d is formed on a surface of the die 5.

In this manufacturing process, first, as shown in FIG. 1A, an undercladding layer 2 is formed on a substrate 1.

Various types of organic substrates and inorganic substrates may be used without particular limitation as the substrate 1. Illustrative examples of organic substrates include epoxy substrates, acrylic substrates, polycarbonate substrates and polyimide substrates. Examples of inorganic substrates include silicon substrates and glass substrates. Alternatively, the substrate 1 may be a circuit board, such as a flexible printed wiring board, which is composed of a substrate having a circuit already formed thereon.

The curable resin material for forming the undercladding layer 2 is a material having a lower refractive index at the transmission wavelength of the guided light than the photocurable resin sheet 3 for forming the core 3a. The refractive index at this transmission wavelength is preferably, for example, from about 1.5 to about 1.54. Illustrative examples of such curable resin materials include epoxy resins, acrylic resins, polyimide resins and silicone resins having a refractive index as indicated above.

The thickness of the undercladding layer 2 is not subject to any particular limitation. Specifically, a thickness of, for example, from about 5 to about 15 μm is preferred.

The method of forming the undercladding layer 2 is exemplified by methods in which an uncured curable resin sheet composed of a curable resin material having a predetermined refractive index for forming the undercladding layer 2 is placed on the surface of the substrate 1, then laminated thereto by pressing under applied heat and curing with heat or light; and methods in which a varnish of a liquid curable resin material for forming the undercladding layer 2 is applied by spincoating, bar coating, dipcoating or the like, then is cured by irradiating light or heating.

Figure 1B:
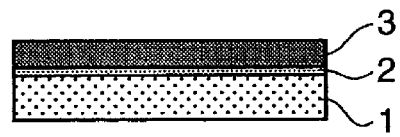

Then, as shown in FIG. 1B, an uncured photocurable resin sheet 3 for forming the core 3a is laminated onto the undercladding layer 2. Such an uncured photocurable resin sheet 3 has a degree of elasticity that enables it to readily deform when pressed.

An uncured photocurable resin sheet which is solid at standard temperature and is composed of a material having a higher refractive index at the transmission wavelength of the guided light than the material of the undercladding layer 2 may be used as the photocurable resin sheet 3. The refractive index at this transmission wavelength is preferably, for example, from about 1.54 to about 1.6. Use may be made of a dry sheet composed primarily of, for example, an epoxy resin, acrylic resin or silicon resin as this photocurable resin. Of these, a photocurable resin sheet composed of an epoxy resin is especially preferred from the standpoint of the balance of physical properties. A photocurable resin sheet made of epoxy resin may be obtained by dissolving an epoxy compound which is liquid at standard temperature and an epoxy compound which is solid at standard temperature in a predetermined ratio within a solvent and adding also a cationic curing initiator so as to form a varnish, then applying the varnish to the surface of a release film such as a release-treated PET film using, for example, a multicoater having a comma coater head, and subsequently drying the applied varnish.

The thickness of the photocurable resin sheet 3 is not subject to any particular limitation. Specifically, a thickness of, for example, from about 20 to about 100 μm is preferred.

Such a photocurable resin sheet 3 may be placed onto the surface of the undercladding layer 2, then laminated with a vacuum laminator or by pressing under applied heat.

Figure 1C:
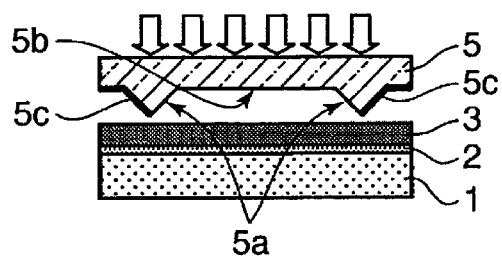

Next, as shown in FIG. 1C, V-shaped grooves for forming mirror faces M having, in the cross-section, 45-degree inclined planes are formed by pressing a die 5 against the laminated photocurable resin sheet (also referred to below as the "uncured resin layer") 3 so that the V-shaped blades 5a penetrate the resin sheet 3 substantially perpendicularly.

The die 5 is made of a material having light transmittivity, illustrative examples of which include transparent resin materials such as epoxy resins, acrylic resins, polyimide resins, polycarbonate resins and silicone resins; and transparent inorganic materials such as glass.

Figure 2:
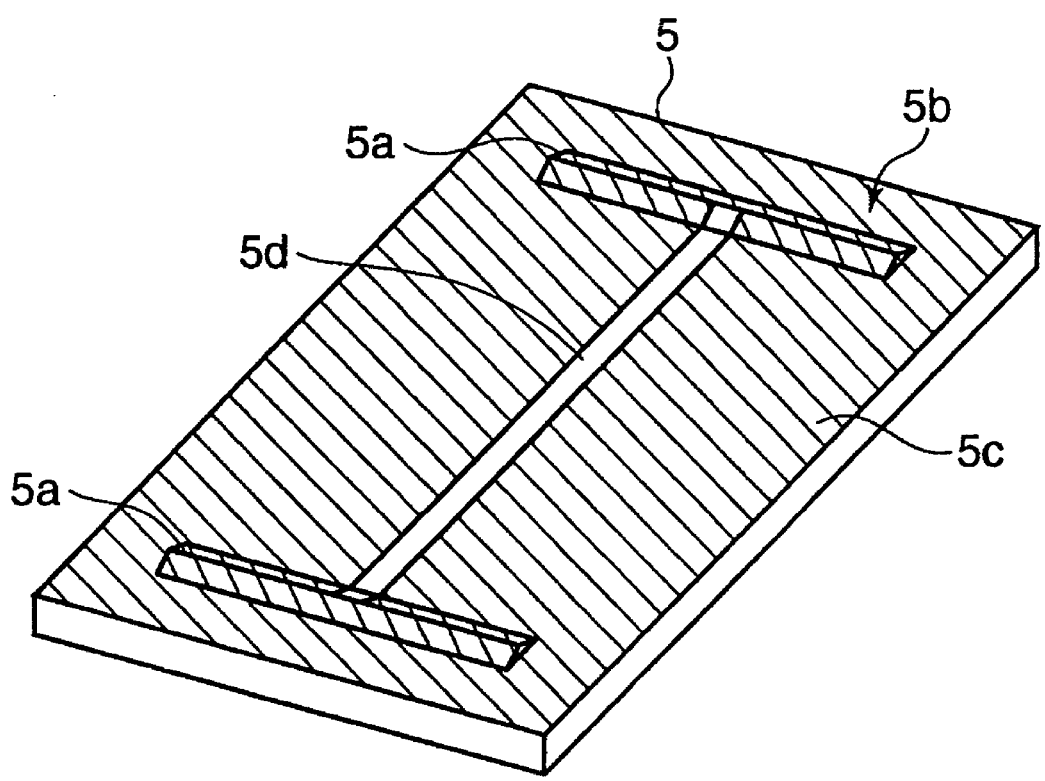
FIG. 2 is a schematic perspective of the top side of a die 5 used in the manufacturing method of the first embodiment.

FIG. 2 is a perspective view of the die 5 with the transfer face shown as the top side. Referring to FIG. 2, the die 5 has a planar transfer face 5b from which V-shaped blades 5a formed so as to have, in cross-section, two 45-degree inclined angles depend at predetermined positions. By using such a die 5 having a planar transfer face 5b, the formation of flash that arises due to upwelling of the resin around the areas where the V-shaped grooves are formed when the V-shaped blades 5a are pressed against the uncured resin layer 3 is suppressed. This is desirable in that post-processing to remove such flash becomes unnecessary, or the formation of irregularities on the core surface that may cause the guided light to diffuse can be suppressed. Also, as shown in FIG. 2, a photomask 5c having a core pattern opening 5d with mirror faces M that are each one of the 45-degree inclined planes positioned at the ends thereof has been formed on the transfer surface 5b of the die 5. Because such a photomask 5c has been formed, as subsequently described, formation of the core 3a and formation of the mirror faces M can be carried out simultaneously, enabling the core 3a and the mirror faces M to be situated at a high positional accuracy.

When the die 5 is pressed against the uncured resin layer 3, if necessary, pressing may be carried out while softening the uncured resin layer 3 by heating the die 5 or the substrate 1. Pressing may be carried out either in such a way that the tips of the V-shaped blades 5a reach the undercladding layer 2, or in such a way that the tips of the blades 5a does not reach the undercladding layer 2.

Figure 1D:
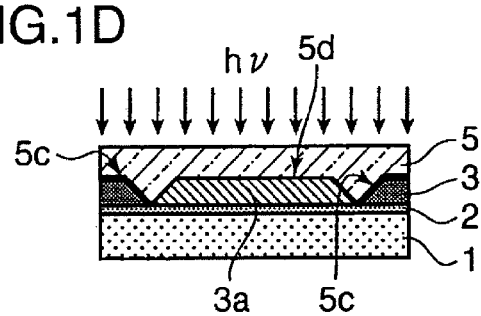
Figure 1E:
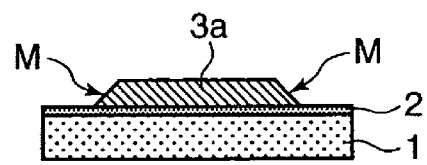

Then, as shown in FIG. 1D, with the die 5 pressed against the uncured resin layer 3, a dose of light sufficient to cure the uncured resin layer 3 is irradiated through the opening 5d in the photomask 5c that has been formed on the die 5. The irradiated areas of the uncured resin layer 3 thus cure, resulting in the formation of a core 3a in accordance with the pattern of the opening 5d in the photomask 5c. After such selective exposure has been carried out, the die 5 is released, following which development is carried out, thereby forming, as shown in FIG. 1E, a core 3a having mirror faces M at the ends thereof.

Development involves the removal of uncured areas by using a developer to wash away, in the case of positive development, those areas that were not subjected to exposure treatment, and in the case of negative development, those areas that were subjected to exposure treatment. Illustrative examples of developers include acetone, isopropyl alcohol, toluene, ethylene glycol, and mixtures thereof in predetermined proportions. Alternatively, it is also possible to use an aqueous developer. Development methods that may be used include methods in which the developer is sprayed on with a sprayer and methods in which ultrasonic cleaning is used.

In the release of the die 5, because the photocurable resin sheet 3 is generally a solid at standard temperature, substantially no uncured resin ingredients adhere to the die 5 at the time of release. Hence, there is no need to carry out the task of cleaning the die 5 after each pressing operation.

To increase the reflectance of the mirror faces M, it is advantageous to form a reflective film composed of a metal material such as gold or a dielectric multilayer film on the surface of the mirror faces M by a known method such as vapor deposition, sputtering or a nanopaste process.

Figure 1F:
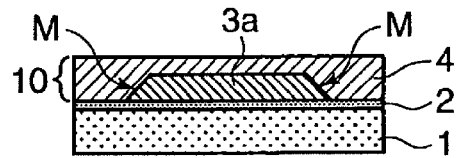

Next, as shown in FIG. 1F, an overcladding layer (second cladding layer) 4 is formed so as to cover the core 3a and the undercladding layer 2.

The method of forming the overcladding layer 4 is exemplified by a method in which a curable resin sheet for forming the overcladding layer 4, that consists of a curable resin material having a controlled refractive index, is laminated onto the core 3a so as to bury the core 3a, then is cured with light or heat. In another exemplary method, a liquid curable resin material for forming the overcladding layer 4 is coated over the core 3a, then cured.

The curable resin material for forming the overcladding layer 4 may be used without particular limitation, provided it is a material having a lower refractive index at the transmission wavelength of the guided light than the refractive index of the core 3a. The same material as the material for forming the undercladding layer 2 may generally be used.

The thickness of the overcladding layer 4 is not subject to any particular limitation. For example, a thickness of about the same degree as the thickness of the undercladding layer 2 is preferred. By means of the foregoing steps, an optical waveguide 10 is formed on the substrate 1 in the manner shown in FIG. 1F.

Because the mirrors M on the optical waveguide 10 formed in this way are formed by pressing the die 5 having V-shaped blades 5a against the uncured resin layer 3 that has been formed on the surface of the undercladding layer 2 while the resin layer 3 is in an uncured state, the surface state of the V-shaped blades 5a is directly transferred. Therefore, in cases where the surface state of the V-shaped blades 5a has a high smoothness, mirror faces M having a smooth surface free of the presence of cutting debris such as forms with the use of a dicing blade are achieved. As a result, light loss during reflection at the mirrors M is suppressed.

Second Embodiment

Another embodiment of the method of manufacturing an optical waveguide having a mirror face according to the invention is described while referring to the attached diagrams. Because those elements designated by the same reference symbols as in the first embodiment share the same features as in the first embodiment, detailed explanations are omitted here.

FIG. 3 schematically shows the steps in the manufacture of a planar optical waveguide 20 having mirror faces M. The features differing from the first embodiment are as follows: instead of a die 5 on which a photomask 5c has been formed, use is made of a die 15 on which a photomask has not been formed and which is equipped with a V-shaped blade 15a on a planar transfer face; and selective exposure is carried out using a separately furnished photomask 6. With regard to other features, the same steps as in the first embodiment are provided.

Figure 3A:
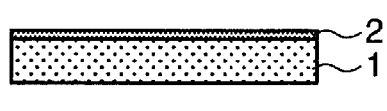
FIG. 3A to 3H are schematic cross-sectional views illustrating a method of manufacture according a second embodiment of the invention.
Figure 3E:
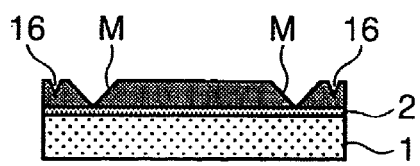
Figure 3B:
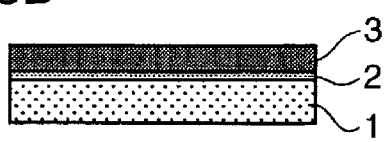

In the method of manufacture according to the second embodiment, first, as shown in FIG. 3A, an undercladding layer 2 is formed on the surface of a substrate 1. Then, as shown in FIG. 3B, a photocurable resin sheet 3 for forming a core is laminated onto the undercladding layer 2 that has been formed. The above steps are the same as in the manufacturing method of the first embodiment.

Figure 3F:
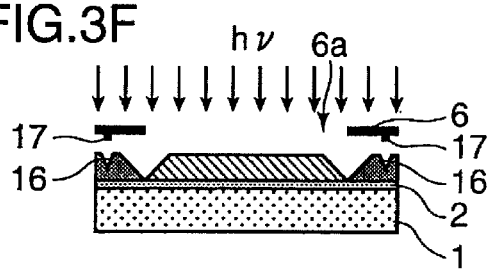
Figure 3C:
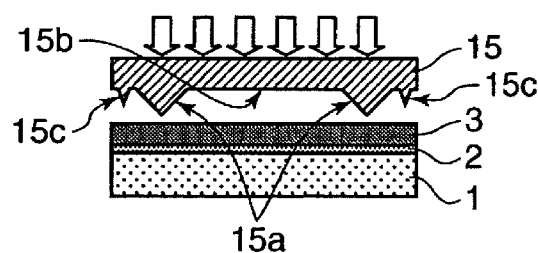

Next, as shown in FIG. 3C, for the laminated uncured resin sheet (uncured resin layer), a die 15 formed in such a way that V-shaped blades 15a which have been formed so as to have, in cross-section, two 45-degree inclined angles hang downward from a planar transfer face 15b is pressed against the uncured resin layer 3, transferring the shape of the V-shaped blades 15a to the uncured resin layer 3, and thereby forming V-shaped grooves having two 45-degree inclined planes.

Figure 4:
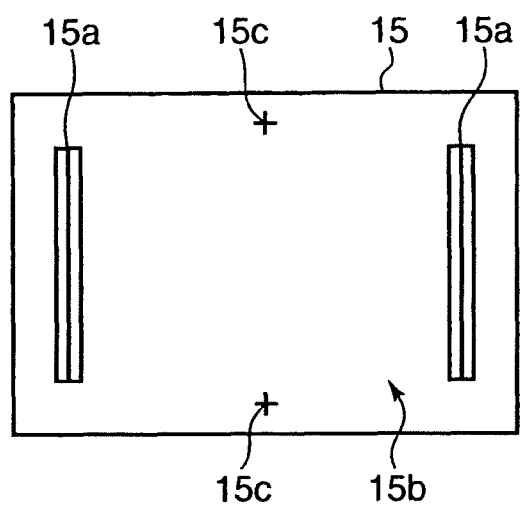
FIG. 4 is a schematic top view of a die 15 used in the manufacturing method of the second embodiment.

FIG. 4 shows a top view of the die 15 from the transfer face side thereof. As shown in FIG. 4, the die 15 has a planar transfer face 15b with V-shaped blades 15a formed at predetermined positions thereon. Also, the transfer face 15b of the die 15 has formed thereon cross-shaped uneven features 15c for the formation of, by pressing, at least two alignment marks on the surface of the uncured resin layer 3. By then pressing the die 15 against the uncured resin layer 3, V-shaped grooves for forming mirror faces M are created on the surface of the uncured resin layer 3, along with which the shapes of the uneven features 15c are transferred, forming alignment marks 16. The die 15 may be made of a material having light transmittivity, or may be made of a material such as metal which does not have light transmittivity.

After the die 15 has been pressed against the uncured resin layer 3, the die 15 is released from the uncured resin layer 3. At this time, as shown in FIG. 3E, V-shaped grooves having 45-degree inclined faces and alignment marks 16 are formed on the surface of the uncured resin layer 3.

Figure 3G:
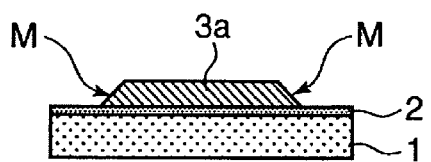
Figure 3D:
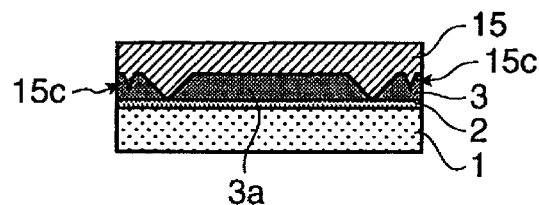
Figure 5:
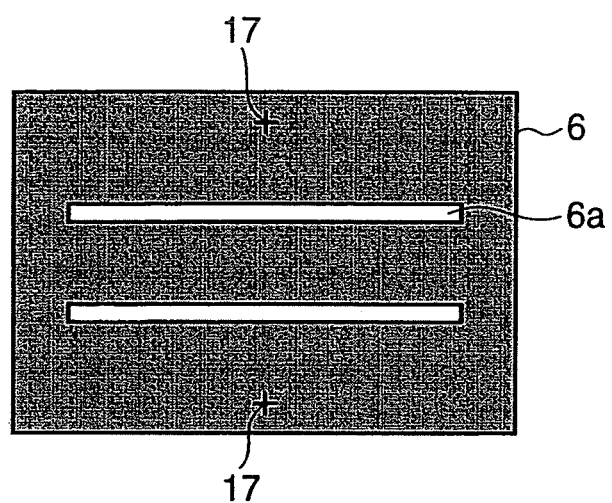
FIG. 5 is a schematic top view of a photomask 6 used in the manufacturing method of the second embodiment.
Figure 6:
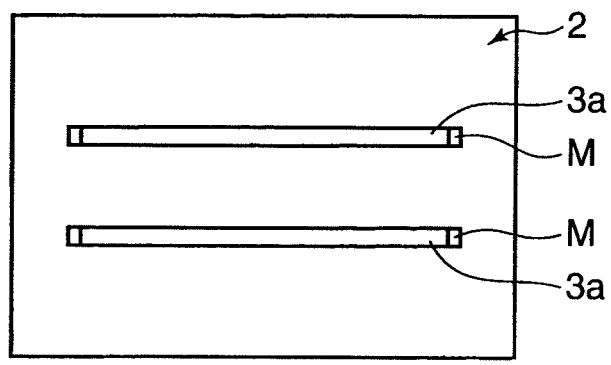
FIG. 6 is a schematic top view of the substrate following development that was used in the manufacturing method of the second embodiment.

Then, as shown in FIG. 3F, a photomask 6 is placed on the uncured resin layer 3 and the uncured resin layer 3 is exposed, through openings 6*a* in the photomask 6, to light having a wavelength capable of curing the uncured resin layer 3, at the dose required for curing. As shown in FIG. 5, the photomask 6 has pre-formed thereon at least two alignment marks 17 for alignment with the alignment marks 16 which have been formed on the surface of the uncured resin layer 3. Alignment is then carried out so that the alignment marks 17 formed on the photomask 6 coincide with the alignment marks 16 on the surface of the uncured resin layer 3. Following alignment, the uncured resin layer 3 is exposed to light through the openings 6*a* in the photomask 6. Next, following exposure, cores 3*a* having mirror faces M at the ends are formed as shown in FIG. 3G by carrying out development. FIG. 6 shows a top view of, following development, the substrate 1 on which the uncured resin layer 3 has been formed. Following formation of the cores 3*a*, it is preferable to form a reflective film on the surfaces of the mirror faces M.

Figure 3H:
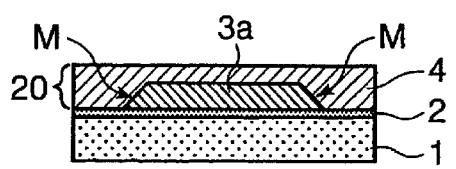

Next, as shown in FIG. 3H, an overcladding layer (second cladding layer) 4 is formed so as to cover the cores 3*a*, thereby forming optical waveguides 20.

In the method of manufacture according to the present embodiment, alignment marks 16 which enable the positional relationship between the cores 3*a* and the mirror faces M to be controlled to a high precision on the surface of the uncured resin layer 3 can be formed on the die 15. As a result, the positional relationship between the core 3*a* and the mirror faces M can be controlled to a high precision, enabling mirrors having an excellent reflection efficiency to be formed.

Third Embodiment

A further embodiment of the inventive method of manufacturing an optical waveguide having a mirror face is described while referring to the attached diagrams. Because those elements designated by the same reference symbols as in the first embodiment share the same features as in the first embodiment, detailed explanations are omitted here.

FIG. 7 schematically shows the steps in the manufacture of a planar optical waveguide 30 having mirror faces M. One feature differing from the first embodiment is that, instead of using a die 5 equipped with V-shaped blades at specific positions on a die having a planar transfer face, use is made of a die 25 which, as shown in FIG. 8A, lacks a planar transfer face and possesses a double-edge having, in cross-section, two 45-degree inclined angles. Also, selective exposure is carried out using a separately furnished photomask 6. With regard to other features, the same steps as in the first embodiment are provided.

Figure 7A:
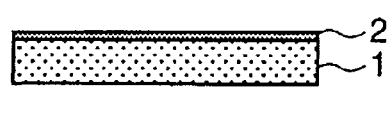
FIGS. 7A to 7H are schematic cross-sectional views illustrating a method of manufacture according a third embodiment of the invention.
Figure 7B:
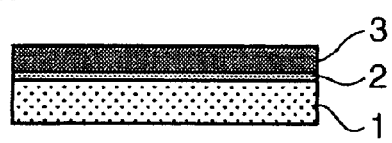
Figure 8A:
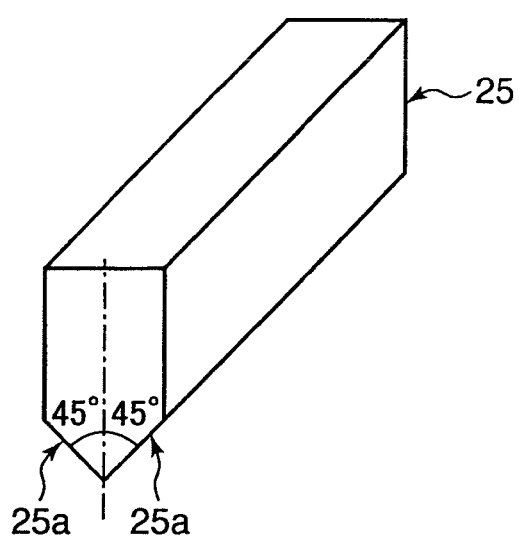
FIGS. 8A and 8B are schematic views illustrating a die 25 used in the manufacturing method of the third embodiment, and a modified form thereof.

In the method of manufacture according to the third embodiment, first, as shown in FIG. 7A, an undercladding layer 2 is formed on a substrate 1. Then, as shown in FIG. 7B, a photocurable resin sheet 3 for forming a core 3*a* is laminated onto the undercladding layer 2 that has been formed. The above steps are the same as in the manufacturing method of the first embodiment.

Figure 7C:
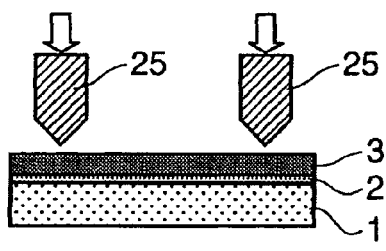

Then, as shown in FIG. 7C, dies 25 are pressed substantially perpendicularly against the uncured resin layer 3 from above the regions where mirror faces M are to be formed in the laminated photocurable resin sheet 3 (uncured resin layer).

The dies 25 are each formed, as shown in the perspective view in FIG. 8A, solely from a blade which possesses a double edge having, in cross-section, two 45-degree inclined angles. Because such a die is composed solely of a blade, production of the die is easy. By pressing the die 25 substantially perpendicularly against the uncured resin layer 3, a V-shaped groove having two 45-degree inclined faces for forming mirror faces M is formed. The dies 25 may be formed of a material which transmits light, or may be formed of a material such as metal which does not transmit light.

Figure 7D:
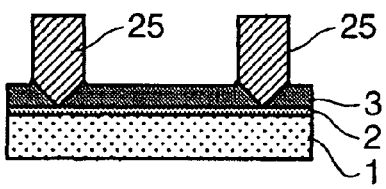
Figure 7E:
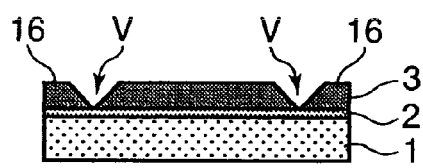

As shown in FIG. 7D, after the dies 25 have been pressed against the uncured resin layer 3, the dies 25 are released from the uncured resin layer 3. At this time, as shown in FIG. 7E, V-shaped grooves V having two 45-degree inclined faces form on the surface of the uncured resin layer 3.

Figure 7F:
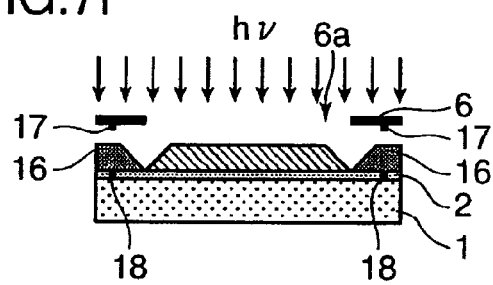
Figure 7G:
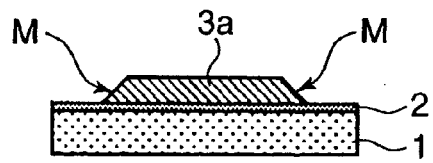

Next, as shown in FIG. 7F, a photomask 6 is placed on the surface of the uncured resin layer 3, and the uncured resin layer 3 is selectively cured by irradiating it, through an opening 6*a* in the photomask 6, with light having a wavelength capable of curing the uncured resin layer 3, in the dose required for curing. Also, as shown in FIG. 5, two alignment marks 17 are formed on the photomask 6. Separately, two alignment marks 18 are formed beforehand on the substrate 1 as well. By then having the alignment marks 17 formed on the photomask 6 and the alignment marks 18 formed on the substrate coincide with each other, the position where the core 3 will form becomes aligned with the mirror faces M. Next, following alignment, selective exposure of the uncured resin layer 3 is carried out through the opening 6*a* in the photomask 6. Following exposure, by then carrying out development, as shown in FIG. 7G, a core 3*a* having at the ends thereof mirror faces M with 45-degree inclined faces is formed. After formation of the core 3*a*, a reflective film is formed on the surface of the mirror faces M.

Figure 7H:
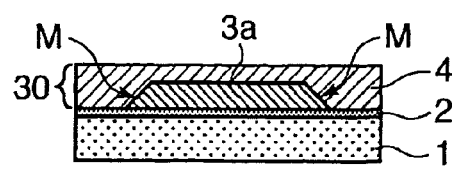

Then, by forming an overcladding layer (second cladding layer) 4 so as to cover the cover 3*a* and the undercladding layer 2, a planar optical waveguide 30 as shown in FIG. 7H is formed.

Figure 8B:
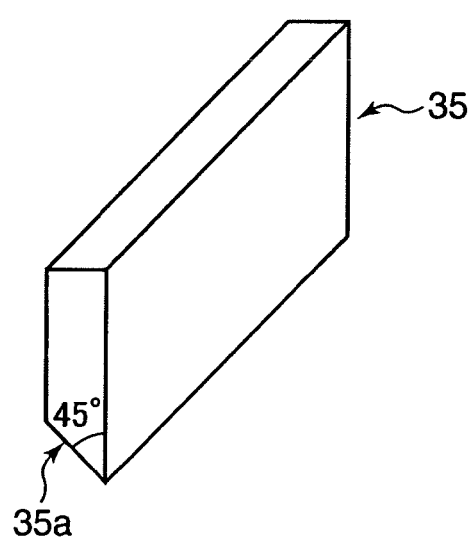
Figure 9:
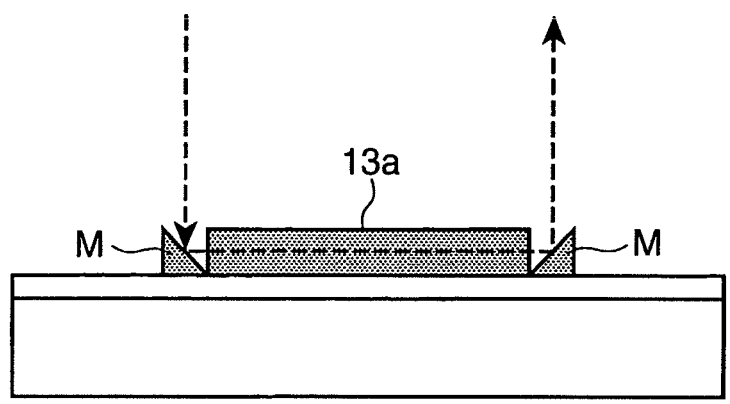
FIG. 9 is a schematic view of an optical waveguide having mirror portions obtained with the die shown in FIG. 8B.

In FIG. 7, an example in which a die 25 having a double-edged blade 25*a* as shown in FIG. 8A was described. However, it is also possible to form mirror faces using a die 35 having a single-edged blade 35*a* as shown in FIG. 8B. In cases where a die 35 having a single-edged blade 35*a* is used, as shown in FIG. 9, it is possible to form mirrors M in a manner that is independent of the core 13*a*. The arrows in FIG. 9 indicate the path of the guided light that enters and leaves the optical waveguide.

Devices for pressing dies against uncured resin layers that may be used in the first to third embodiments described above are not subject to any particular limitation, as far as they are able to transfer the shapes of dies by pressing dies against resin sheets for forming mirror and by applying pressure and/or heating. In particular, it is preferable to use a device equipped with a camera which recognize the V-shaped blade position and mirror-forming position of dies and a stage movable with submicron accuracy. Dies are preferably removable. In addition, such device is preferably able to heat dies, particularly in the range of ambient temperature (uncontrolled temperature) to about 120° C. Furthermore, such device is preferably able to apply pressure against dies, particularly in the range of about 0.05M to 0.5 MPa.

It is preferable that dies have a layer for improving their release from resin sheets. By placing such layer, the adhesion of resin to dies is suppressed and thus an intended V-shaped groove will be likely obtained. As a material for such layer, fluorinated resin such as teflon is mainly used. Thickness of the layer is preferably from about 0.1 to about 2 μm. It is more desirable to form dies by using a material which is hardly adhere resin sheets in advance, so that there is no need to form the said release layer. In case of dies which are not required to be transparent, such as die 15 of the second embodiment or die 25 of the third embodiment, dies may be formed from fluorinated resin itself like teflon.

The invention is described more fully below by way of working examples, although the scope of the invention is in no way limited by these examples.

EXAMPLES

First, the method of producing the photocurable resin sheets used in the working examples is described.

Production of Photocurable Resin Sheet a for Undercladding

An epoxy resin varnish was prepared by dissolving 7 parts by mass of polypropylene glycol glycidyl ether (PG 207, available from Tohto Kasei Co., Ltd.), 25 parts by mass of a liquid hydrogenated bisphenol A-type epoxy resin (YX 8000, available from Japan Epoxy Resins Co., Ltd.), 20 parts by mass of a solid hydrogenated bisphenol A-type epoxy resin (YL 7170, available from Japan Epoxy Resins Co., Ltd.), 8 parts by mass of a 1,2-epoxy-4-(2-oxiranyl)cyclohexane addition product of 2,2-bis(hydroxymethyl)-1-butanol (EHPE 3150, available from Daicel Chemical Industries, Ltd.), 2 parts by mass of a solid bisphenol A-type epoxy resin (Epikote 1006FS, available from Japan Epoxy Resins Co., Ltd.), 20 parts by mass of a phenoxy resin (YP50, available from Tohto Kasei Co., Ltd.), 0.5 part by mass of a photocationic curing initiator (SP170, available from Adeka Corporation), 0.5 part by mass of a thermocationic curing initiator (SI-150L, available from Sanshin Chemical Industry Co., Ltd.) and 0.1 part by mass of a surface modifier (F470, available from DIC Corporation) in 30 parts by mass of toluene and 70 parts by mass of MEK as the solvents, filtering the solution with a membrane filter having pore size of 1 μm, then vacuum deaeration. This epoxy resin varnish was applied with a bar coater onto a PET film having a thickness of 50 μm, and subjected to 10 minutes of primary drying at 80° C., following by 10 minutes of secondary drying at 120° C. Finally, this was covered with a 35 μm OPP film as a protective film. The photocurable resin sheet A for undercladding thus obtained had a film thickness of 15 μm and had a refractive index to light with a wavelength of 579 nm of 1.54.

Production of Photocurable Resin Sheet B for Core

An epoxy resin varnish was prepared by dissolving 42 parts by mass of a liquid bisphenol A-type epoxy resin (Epiclon 850S, available from DIC Corporation), 55 parts by mass of a solid bisphenol A-type epoxy resin (Epikote 1006FS, available from Japan Epoxy Resins Co., Ltd.), 3 parts by mass of phenoxy resin (YP50, available from Tohto Kasei Co., Ltd.), 1 part by mass of a photocationic curing initiator (SP170, available from Adeka Corporation) and 0.1 part by mass of a surface modifier (F470, available from DIC Corporation) in 24 parts by mass of toluene and 56 parts by mass of MEK as the solvents, filtering the solution with a membrane filter having a pore size of 1 μm, then vacuum deaeration. This epoxy resin varnish was formed into a film in the same way as in "Production of Photocurable Resin Sheet A" described above. The photocurable resin sheet B for a core obtained in this way had a film thickness of 40 μm, and had a refractive index for light with a wavelength of 579 nm of 1.59. Moreover, transmittance at 850 nm exhibited a high refractive index of 0.06 dB/cm.

Production of Photocurable Resin Sheet C for Overcladding

Aside from changing the coating thickness of the epoxy resin varnish, a photocurable resin sheet C for overcladding was obtained by film formation in the same way as in "Production of Photocurable Resin Sheet A" described above. The photocurable resin sheet C obtained in this way had a film thickness of 55 μm, and had a refractive index for light with a wavelength of 579 nm of 1.54.

Working Example 1

A method of manufacturing an optoelectronic composite wiring board is described while referring to FIG. 10.

An electrical circuit 51 was formed by patterning the copper foil on one side of a flexible double-sided copper-clad laminate (FELIOS (R-F775), produced by Panasonic Electric Works Co., Ltd.) obtained by laminating 12 μm thick copper foil on both sides of a 25 μm thick polyimide film. The entire surface of the copper foil on the other side of the laminate was removed by etching. In this way, a flexible printed circuit (FPC) having outside dimensions of 130 mm×130 mm like the FPC 50 shown in FIG. 10A was manufactured.

Figure 10A:
FIGS. 10A to 10J are schematic diagrams illustrating the method of manufacturing an optical waveguide in Working Example 1.
Figure 10B:
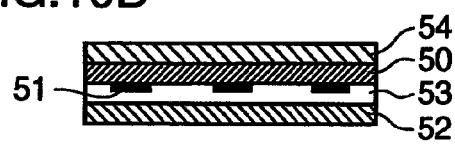

Next, as shown in FIG. 10B, a strong adhesive side of a removable double-sided adhesive tape 53 (No. 7692, available from Teraoka Seisakusho Co., Ltd.) was laminated onto the entire surface of a glass plate 52 (140 mm×140 mm×2 mm thick) using a compressed air injection-type vacuum laminator (V-130, manufactured by Nichigo-Morton Co., Ltd.) at 60° C. and 0.2 MPa. The side of the FPC 50 having the electrical circuit 51 formed thereon was then laminated to a weak adhesive side of the double-sided adhesive tape 53, thereby temporarily bonding the FPC 50 to the glass plate 52. Next, after peeling the PET film from one side only of an undercladding-forming photocurable resin sheet A, the photocurable resin sheet A was laminated by means of a vacuum laminator onto the surface of the FPC 50 on the side where the electrical circuit 51 had not been formed. The surface of the undercladding-forming photocurable resin sheet A was then exposed to 2 J/cm$^2$ of UV light using an ultrahigh-pressure mercury vapor lamp, and the PET film on the other side was peeled off, then 30 minutes of heat treatment was carried out at 150° C., thereby forming an undercladding 54. The surface of the undercladding 54 thus formed was then subjected to oxygen plasma treatment.

Figure 10C:
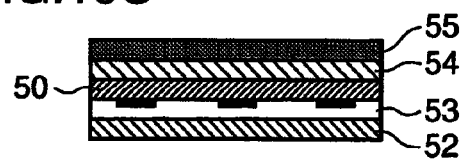
Figure 10D:
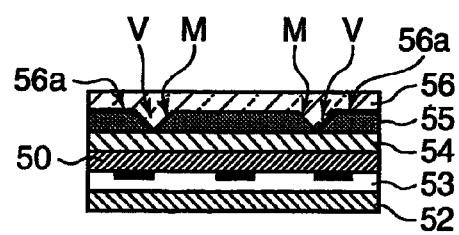

Then, as shown in FIG. 10C, the core-forming photocurable resin sheet B was laminated with a vacuum laminator onto the surface of the undercladding 54, thereby forming an uncured resin layer 55. Then, as shown in FIG. 10D, a die 56 similar to that described in the first embodiment which was equipped on a planar transfer face with a V-shaped blade having, in cross-section, two 45-degree inclined angles was pressed against the surface of the uncured resin layer 55 until the tip of the blade reached the undercladding 54, thereby forming a V-shaped groove V having, in cross-section, two 45-degree inclined planes. The die 56 had formed thereon a negative mask 56a with a linear pattern of slits of 40 μm width and 120 mm length. A mirror M as one of the inclined faces in each of the V-shaped grooves V was formed at, respectively, a specific mounting position for a light-emitting element and a specific mounting position for a light-receiving element on the electrical circuit 51 of the FPC 50.

Figure 10E:
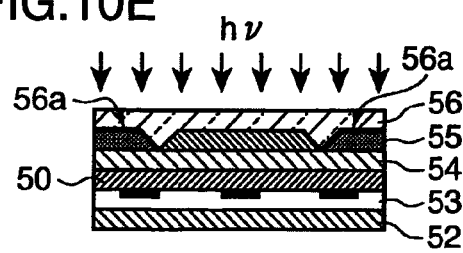

Then, as shown in FIG. 10E, with the die 56 still pressed thereto, the uncured resin layer 55 was selectively exposed and photocured by irradiating 3 J/cm$^3$ of UV light with an ultrahigh-pressure mercury vapor lamp from an outer surface side of the die 56 through slits in the negative mask 56a.

Figure 10F:
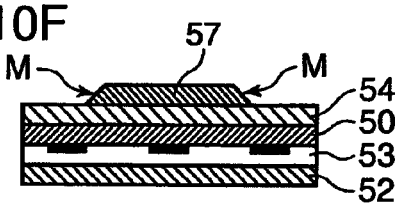

Next, 2 minutes of heat treatment was carried out at 140° C. The unexposed portions of the uncured resin layer 55 were then dissolved and removed by development using a water-based flux cleaner (Pinealpha ST-100SX, produced by Arakawa Chemical Industries, Ltd.) adjusted to 55° C., after which rinsing with water was carried out. Then, moisture on the surface was removed by air blowing, following which 10 minutes of drying at 100° C. was carried out, thereby forming a core 57 having mirror faces M as shown in FIG. 10F.

Figure 10G:
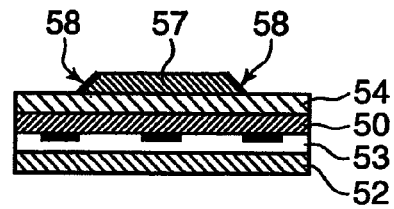

Next, as shown in FIG. 10G, a 1000 Å thickness of gold was vacuum deposited onto the surface of the mirror faces M through a metal mask with openings only at the regions where the mirror faces M were formed, thereby giving micromirrors 58.

Figure 10H:
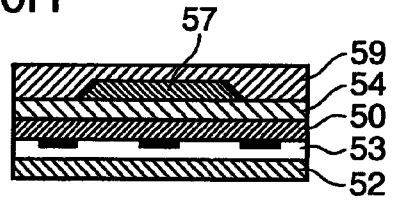
Figure 10I:
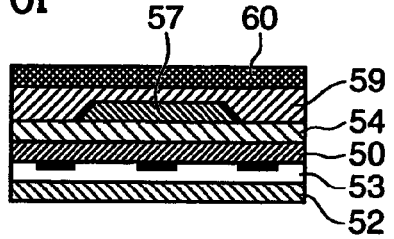

Then, as shown in FIG. 10H, the overcladding-forming photocurable resin sheet C was laminated with a vacuum laminator at 80° C. and 0.3 MPa so as to cover the undercladding 54 and the core 57. Then, after 30 minutes of heat treatment at 120° C., the laminated uncured resin sheet C was irradiated with 2 J/cm$^2$ of UV light from an ultrahigh-pressure mercury vapor lamp, then heat-treated again for 30 minutes at 150° C., thereby forming an overcladding 59. The surface of the overcladding 59 that had formed was then subjected to oxygen plasma treatment.

Figure 10J:
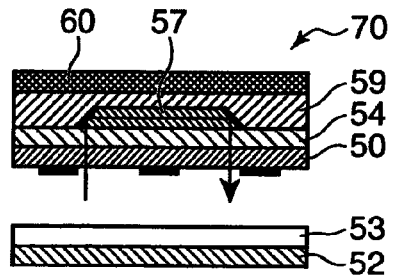

Next, as shown in FIG. 10J, a coverlay film 60 was laminated onto the surface of the overcladding 59 with a vacuum laminator at 120° C. and 0.3 MPa, following which it was heated at 160° C. for 1 hour and thereby cured. A polyimide film (Halogen-Free Coverlay Film R-CAES, produced by Panasonic Electric Works Co., Ltd.) having a thickness of 125 μm and including a 15 μm thick adhesive layer was used as the coverlay film 60.

Next, as shown in FIG. 10J, the glass plate 52 was peeled from the weak adhesive side of the double-sided pressure-sensitive adhesive tape 53, following which the completed structure was cut into 5 mm wide strips, thereby obtaining optoelectronic composite wiring boards 70 on which had been formed an optical waveguide composed of a core 57 buried within a cladding formed of an undercladding 54 and an overcladding 59. In this optoelectronic composite wiring board 70, the path of guided light which enters and leaves the optical waveguide is indicated by the arrows shown in FIG. 10J.

Working Example 2

A method of manufacturing an optoelectronic composite wiring board is described while referring to FIG. 11.

Figure 11A:
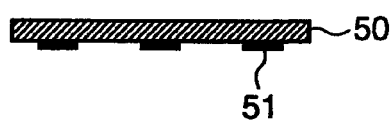
FIGS. 11A to 11J are schematic diagrams illustrating the method of manufacturing an optical waveguide in Working Example 2.
Figure 11B:
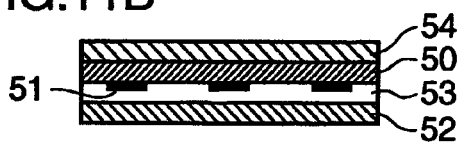
Figure 11C:
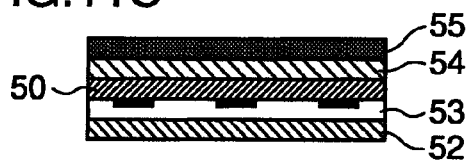

An uncured resin layer 55 was formed by using a vacuum laminator to laminate a core-forming photocurable resin sheet B onto the surface of an undercladding 54 via the steps shown in FIGS. 11A to 11C, which are similar to the steps used in Working Example 1.

Figure 11D:
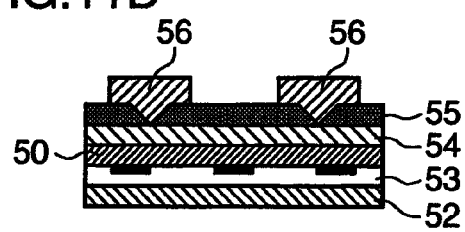

Then, as shown in FIG. 11D, two dies 56, 56, each equipped with a V-shaped blade having, in cross-section, two 45-degree inclined angles, were pressed against the surface of the uncured resin layer 55 until the tips thereof reached the undercladding 54, thereby forming V-shaped grooves having, in cross-section two 45-degree inclined planes. The dies 56, 56 were subsequently released.

Figure 11E:
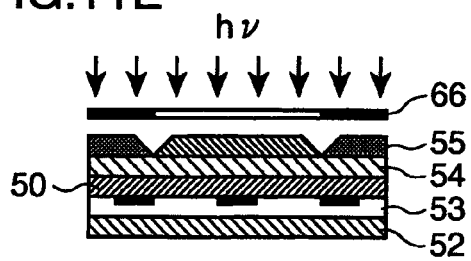

Next, as shown in FIG. 11E, a negative mask 66 with a linear pattern of slits of 40 μm width and 120 mm length was disposed in such a way that alignment marks (not shown) formed on the substrate 50 coincided with alignment marks (not shown) formed on the negative mask 66. Then, 3 J/cm$^2$ of UV light was irradiated through slits in the negative mask 66 from an ultrahigh-pressure mercury vapor lamp, thereby selectively exposing and photocuring the uncured resin layer 55.

Figure 11F:
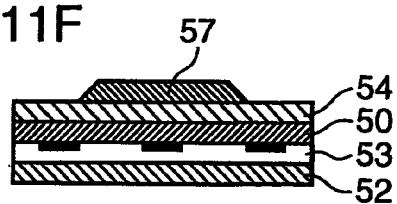
Figure 11G:
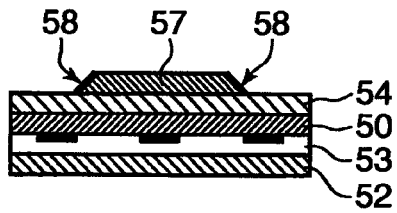
Figure 11H:
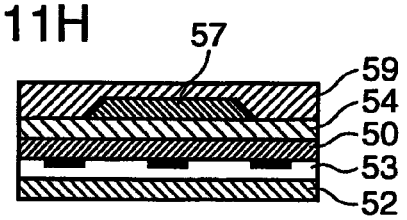
Figure 11I:
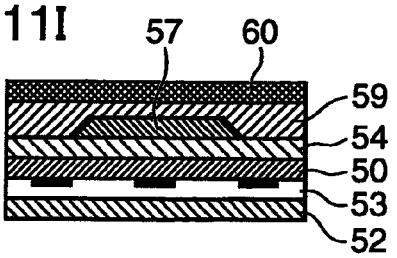
Figure 11J:
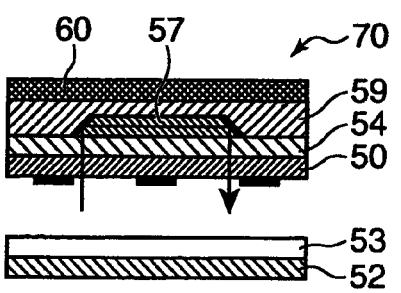

Next, 2 minutes of heat treatment was carried out at 140° C. The unexposed portions of the uncured resin layer 55 were then dissolved and removed by development using a water-based flux cleaner (Pinealpha ST-100SX, produced by Arakawa Chemical Industries, Ltd.) adjusted to 55° C., after which rinsing with water was carried out. Then, moisture on the surface was removed by air blowing, following which 10 minutes of drying at 100° C. was carried out, thereby forming a core 57 having mirror faces M as shown in FIG. 11F.

The subsequent steps, shown in FIGS. 11G to 11J, were carried in the same manner as the steps described in Working Example 1 while referring to FIGS. 10G to 10J, thereby obtaining optoelectronic composite wiring boards 70 on which had been formed an optical waveguide composed of a core 57 buried within a cladding formed of an undercladding 54 and an overcladding 59. In this optoelectronic composite wiring board 70, the path of guided light which enters and leaves the optical waveguide is indicated by the arrows shown in FIG. 11J.

Working Example 3

A method of manufacturing an optoelectronic composite wiring board is described while referring to FIG. 12.

The undercladding-forming photocurable resin sheet A was laminated onto a 140 mm×120 mm temporary substrate 80 made of polycarbonate resin using a vacuum laminator. The surface of the undercladding-forming photocurable resin sheet A was then exposed to 2 J/cm$^2$ of UV light from an ultrahigh-pressure mercury vapor lamp, then heat treated for 30 minutes at 150° C., thereby forming the undercladding 81 shown in FIG. 12A. The surface of the undercladding 81 was then subjected to oxygen plasma treatment.

Figure 12A:
FIGS. 12A to 12I are schematic diagrams illustrating the method of manufacturing an optical waveguide in Working Example 3.
Figure 12B:

Next, as shown in FIG. 12B, the core-forming photocurable resin sheet B was laminated onto the surface of the undercladding 81 using a vacuum laminator, thereby forming an uncured resin layer 82.

Figure 12C:
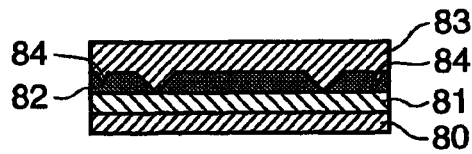

Next, as shown in FIG. 12C, for the surface of the uncured resin layer 82, a die 83 which, like that described in the second embodiment, was provided with a V-shaped blade having two edges defined by, in cross-section, the intersection of two 45-degree inclined planes, with the blade being formed so as to hang downward from a planar transfer face, and which was provided with cross-shaped uneven features for forming alignment marks was pressed until the tip thereof reached the undercladding 82, after which the die 83 was released, thereby forming V-shaped grooves V having, in cross-section, 45-degree inclined planes and two alignment marks 84.

Figure 12D:
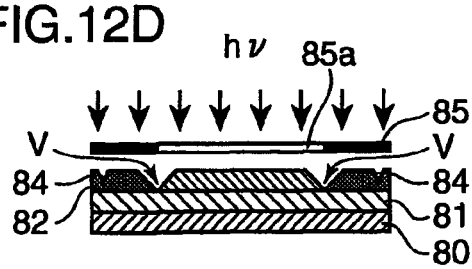

Next, as shown in FIG. 12D, a negative mask 85 with a linear pattern of slits 85a of 40 μm width and 120 mm length was placed thereon and positioned by aligning the alignment marks on the negative mask 85 with the alignment marks 84 formed on the surface of the uncured resin layer 82, following which the surface of the uncured resin layer 82 was exposed by irradiating 3 J/cm$^2$ of UV light from an ultrahigh-pressure mercury vapor lamp, thereby photocuring the portions of the uncured resin layer 82 corresponding to the slits 85a.

Figure 12E:
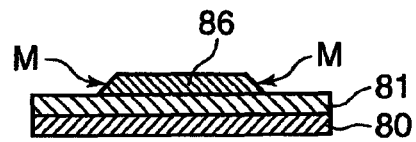

Two minutes of heat treatment at 140° C. was then carried out. The unexposed portions of the uncured resin layer 82 were then dissolved and removed by development using as the developer a water-based flux cleaner (Pinealpha ST-100SX, produced by Arakawa Chemical Industries, Ltd.) adjusted to 55° C. After a final cleansing with water and air blowing, 10 minutes of drying at 100° C. was carried out, thereby forming a core 86 having mirror faces M as shown in FIG. 12E.

Figure 12F:
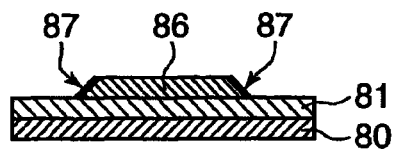

Then, as shown in FIG. 12F, a 1000 Å thickness of gold was vacuum deposited onto the surfaces of the mirror faces M through a metal mask with openings only at the regions where the mirror faces M had been formed, thereby giving micromirrors 87.

Figure 12G:
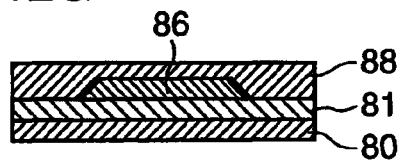
Figure 12H:
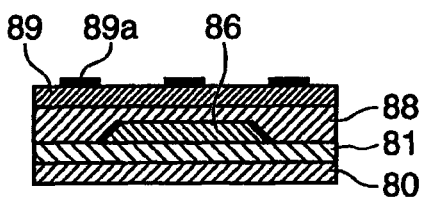

Next, as shown in FIG. 12G, an overcladding-forming uncured resin sheet C (88) was laminated using a vacuum laminator at 80° C. and 0.3 MPa so as to cover the undercladding 81 and the core 86. Then, as shown in FIG. 12H, a substrate 89 on which an electrical circuit 89a had been pre-formed (a double-sided copper-clad laminate R1766, produced by Panasonic Electric Works Co., Ltd., one side of which was etched off and the other side of which had been formed into a circuit) was positioned on the surface of the laminated overcladding-forming uncured resin sheet C (88) and laminated thereto using a vacuum laminator. Exposure at a dose of 2 J/cm$^2$ with an ultrahigh-pressure mercury vapor lamp was then carried out from the temporary substrate 80 side, followed by 1 hour of heat treatment at 140° C., thereby bonding the substrate 89 on which an electrical circuit had been pre-formed.

Figure 12I:
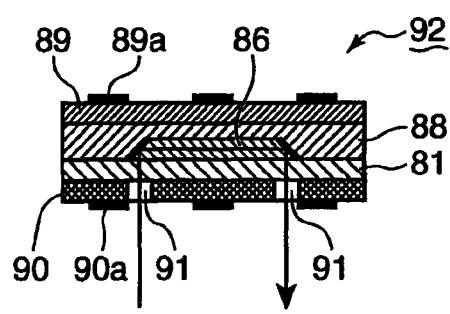

The temporary substrate 80 was subsequently stripped off, following which, as shown in FIG. 12I, a substrate 90 (a double-sided copper-clad laminate R1766, produced by Panasonic Electric Works Co., Ltd., one side of which had been etched off) from which those areas corresponding to the inclined faces had been etched off beforehand was laminated thereto with an adhesive. Next, after forming throughholes (not shown), then copper plating and etching, a circuit 90a having a predetermined pattern was formed. A solder resist was then formed, after which gold plating treatment and screen printing were carried out, thereby forming an electric circuit. In addition, an optical input/output 91 was opened up by routing, thereby giving an optoelectronic composite wiring board 92. In this optoelectronic composite wiring board 92, the path of guided light which enters and leaves the optical waveguide is indicated by the arrows shown in FIG. 12I.

Evaluation of Light Loss

Measurement of light loss in the optical waveguides formed on the respective optoelectronic composite wiring boards obtained in Working Examples 1 to 3 was carried out as follows. The end of an optical fiber having a core diameter of 10 μm and a numerical aperture (NA) of 0.21 was connected through matching oil (silicone oil) at a place corresponding to the micromirror at one end of the core on the surface of the optoelectronic composite wiring board, and the end of an optical fiber having a core diameter of 200 μm and a NA of 0.4 was connected through matching oil at a place corresponding to the micromirror at the other end of the core. Light from an LED light source having a wavelength of 850 nm was introduced to the optical waveguide A from the optical fiber having a core diameter of 10 μm and a NA of 0.21, and the power (P1) of light leaving the optical waveguide A through the optical fiber having a core diameter of 200 μm and a NA of 0.4 was measured with a power meter. In addition, the ends of both optical fibers were butted together and the light power (P0) in a state where the light does not pass through the optical waveguide A was measured with a power meter. The light loss by the optical waveguide in the optoelectronic composite wiring board was determined from a formula for calculating the negative log 10 value (P1/P0). Also, to measure the light loss of only the optical waveguide portion of the optoelectronic composite wiring board, the micromirror portions at both ends of the optoelectronic composite wiring board were cut off, thereby forming an optical waveguide having a length of 100 mm with 40 μm×40 μm core endfaces exposed at both ends thereof. In the same way as described above, optical fibers were connected to the respective endfaces of the core and the power of light (P1) that passes through and leaves the optical waveguide as well as the power of light (P0) when the optical waveguide is not interposed between the optical fibers were both measured. The loss resulting from the insertion of the optical waveguide was determined from a formula for calculating the negative log 10 value (P1/P0).

The mirror loss was less than 0.5 dB in each case. The waveguide loss was less than 0.1 dB/cm in each case. Hence, the present invention provides optoelectronic composite wiring boards having optical waveguides and mirrors of excellent transparency.

As explained above, the inventive method of manufacturing an optical waveguide having a mirror face includes: a photocurable resin sheet laminating step of laminating an uncured photocurable resin sheet for forming a core on a surface of a first cladding layer that has been formed on a substrate; a mirror face forming step of forming a mirror face for guiding light to a core by pressing a die provided with a blade which possesses a single edge having, in a cross-section, an inclined angle of 45 degrees or a double edge having, in a cross-section, two 45-degree inclined angles such that the blade substantially perpendicularly penetrates the photocurable resin sheet; a core forming step of forming a core having the mirror face positioned at an end thereof by selectively exposing to light, and developing, the photocurable resin sheet; and a cladding layer forming step of forming a second cladding layer so as to bury the core.

In this arrangement, by pressing a die having a blade with a 45-degree inclined angle against a photocurable resin sheet that is uncured and in an elastic state, which sheet is a core material that has been formed on a surface of a first cladding layer, the smooth state of the blade can be directly transferred and formed without leaving cutting marks of the sort that arise when a cutting operation is used. As a result, a smooth-surfaced mirror face can be formed. Also, because a cutting operation using a dicing blade is not employed, light loss of the sort caused by the adherence of cutting debris to the core can be suppressed. In addition, given that a photocurable resin sheet is used to form the core, the task of cleaning the die after each pressing operation to remove uncured resin adhering to the die can be eliminated.

It is preferable for the die to have a planar transfer face and for the blade to hang downward from a predetermined position on the transfer face. In a case such as this where the blade for forming the mirror face has been formed so as to hang downward from the planar transfer face, the swelling of the sheet surface by the resin that wells up when the blade is pressed against the photocurable resin sheet can be held in check and smoothened by the transfer face. Hence, there is no need for post-processing in order to remove such swelling and smoothen the surface. At the same time, because swelling-induced surface irregularities that cause light diffusion are removed, a low-loss optical waveguide can be obtained.

Also, it is preferable for the die having a planar transfer face to be made of a transparent material and to have formed on a surface thereof a photomask having a core pattern opening having the mirror face positioned at an end thereof; and, after the die is pressed in the mirror face forming step, for selective exposure in the core forming step to be carried out through the opening, while keeping the die in a pressed state. Through such an arrangement, the core and the mirror face can be aligned to a high precision, thus enabling a mirror having an excellent reflection efficiency to be formed. Also, because formation of the core and formation of the mirror face can be carried out at the same time, the operations involved can be simplified.

Moreover, it is preferable that an uneven feature for forming an alignment mark (I) on a surface of the photocurable resin sheet be formed by pressing of the die in the mirror face forming step at a predetermined position on the planar transfer face of the die; in the mirror face-forming step, the alignment mark (I) be formed on the photocurable resin sheet surface by transfer of the uneven feature to the photocurable resin sheet; and in the core forming step, in use of a photomask having a core pattern opening having the mirror face positioned at an end thereof and having an alignment mark (II), the photocurable resin sheet be selectively exposed to light through the opening after the photomask is disposed so that the alignment mark (II) coincides with the alignment mark (I). In this way, alignment of the core and the mirror face to a high precision is possible, thus enabling a mirror having an excellent reflection efficiency to be formed.

The inventive optoelectronic composite wiring board is characterized by including, on a substrate having an electrical circuit formed thereon, an optical waveguide formed by any of the foregoing methods of manufacturing an optical waveguide having a mirror face. In optical waveguides with such a mirror face, the mirror loss is reduced, resulting in a low-loss optoelectronic composite wiring board.

INDUSTRIAL APPLICABILITY

According to the present invention, by pressing and transferring a mirror shape to a soft, uncured photocurable resin sheet serving as the core material, the smooth state of the die can be directly transferred without leaving cutting debris as in the case of a cutting operation. For this reason, light loss at the mirror can be reduced. Also, because a photocurable resin sheet is used to form the core, the cleaning of the die that must be carried out with each die pressing operation when a liquid curable resin is used can be eliminated.

The invention claimed is:

1. A method of manufacturing an optical waveguide having a mirror face, the method comprising:
    laminating an uncured photocurable resin sheet for forming a core on a surface of a first cladding layer that has been formed on a substrate;
    forming a mirror face for guiding light to the core by pressing a die to the uncured photocurable resin sheet, the die being provided with a blade which possesses a single edge having, in a cross-section, an inclined angle of 45 degrees or a double edge having, in a cross-section, two 45-degree inclined angles, the die being pressed such that the blade substantially perpendicularly penetrates the photocurable resin sheet;
    after the mirror face forming by pressing the die, forming the core having the mirror face positioned at an end of the core, by selectively exposing the photocurable resin sheet to light, and developing the photocurable resin sheet; and
    forming a second cladding layer so as to bury the core.

2. The method of manufacturing an optical waveguide having a mirror face according to claim 1, wherein the die has a planar transfer face and the blade hangs downward from a predetermined position on the transfer face.

3. The method of manufacturing an optical waveguide having a mirror face according to claim 2, wherein
    the die is made of a transparent material, and a photomask, having a core pattern opening to form the core having the mirror face positioned at the end of the core, is provided on the planer transfer face of the die, and
    after the die is pressed in the mirror face forming, the selective exposure is performed through the opening, while keeping the die in a pressed state, in the core forming.

4. The method of manufacturing an optical waveguide having a mirror face according to claim 2, wherein
    an uneven feature is provided at a predetermined position on the planar transfer face of the die, for forming a first alignment mark on a surface of the photocurable resin sheet by the pressing of the die in the mirror face forming;
    in the mirror face forming, the first alignment mark is formed on the photocurable resin sheet surface by transferring the uneven feature of the planer transfer face to the photocurable resin sheet; and
    in the core forming, a photomask is used, the photomask having a core pattern opening to form the core having the mirror face positioned at the end of the core, and having a second alignment mark, and the photocurable resin sheet is selectively exposed to light through the core pattern opening after the photomask is disposed so that the second alignment mark coincides with the first alignment mark.

5. An optoelectronic composite wiring board comprising, on a substrate having an electrical circuit formed on the substrate, an optical waveguide formed by the method of manufacturing an optical waveguide having a mirror face according to claim 1.

6. A method of manufacturing an optical waveguide having a mirror face, the method comprising:
    laminating an uncured photocurable resin sheet for forming a core on a surface of a first cladding layer that has been formed on a substrate;
    forming a mirror face for guiding light to the core by pressing a die provided with a blade which possesses a single edge having, in a cross-section, an inclined angle of 45 degrees or a double edge having, in a cross-section, two 45-degree inclined angles, such that the blade substantially perpendicularly penetrates the photocurable resin sheet;
    forming the core having the mirror face positioned at an end of the core, by selectively exposing the photocurable resin sheet to light, and developing the photocurable resin sheet; and
    forming a second cladding layer so as to bury the core,
    wherein the die has a planar transfer face and the blade hangs downward from a predetermined position on the transfer face,
    the die is made of a transparent material, and a photomask, having a core pattern opening to form the core having the mirror face positioned at the end of the core, is provided on the planer transfer face of the die, and
    after the die is pressed in the mirror face forming, the selective exposure is performed through the opening, while keeping the die in a pressed state, in the core forming.

7. A method of manufacturing an optical waveguide having a mirror face, the method comprising:
    laminating an uncured photocurable resin sheet for forming a core on a surface of a first cladding layer that has been formed on a substrate;
    forming a mirror face for guiding light to the core by pressing a die provided with a blade which possesses a single edge having, in a cross-section, an inclined angle of 45 degrees or a double edge having, in a cross-section, two 45-degree inclined angles, such that the blade substantially perpendicularly penetrates the photocurable resin sheet;
forming the core having the mirror face positioned at an end of the core, by selectively exposing the photocurable resin sheet to light, and developing the photocurable resin sheet; and
forming a second cladding layer so as to bury the core,
wherein the die has a planar transfer face and the blade hangs downward from a predetermined position on the transfer face,
an uneven feature is provided at a predetermined position on the planar transfer face of the die, for forming a first alignment mark on a surface of the photocurable resin sheet by the pressing of the die in the mirror face forming;
in the mirror face forming, the first alignment mark is formed on the photocurable resin sheet surface by transferring the uneven feature of the planer transfer face to the photocurable resin sheet; and
in the core forming, a photomask is used, the photomask having a core pattern opening to form the core having the mirror face positioned at the end of the core, and having a second alignment mark, and the photocurable resin sheet is selectively exposed to light through the core pattern opening after the photomask is disposed so that the second alignment mark coincides with the first alignment mark.

* * * * *